United States Patent
Aoki et al.

(10) Patent No.: US 9,795,064 B2
(45) Date of Patent: Oct. 17, 2017

(54) HEAT EXCHANGER, COOLING UNIT, AND ELECTRONIC DEVICE

(71) Applicant: FUJITSU LIMITED, Kawasaki-shi, Kanagawa (JP)

(72) Inventors: Michimasa Aoki, Kawasaki (JP); Masumi Suzuki, Kawasaki (JP); Jie Wei, Hachioji (JP)

(73) Assignee: FUJITSU LIMITED, Kawasaki (JP)

( * ) Notice: Subject to any disclaimer, the term of this patent is extended or adjusted under 35 U.S.C. 154(b) by 48 days.

(21) Appl. No.: 14/972,186

(22) Filed: Dec. 17, 2015

(65) Prior Publication Data
US 2016/0205809 A1 Jul. 14, 2016

(30) Foreign Application Priority Data
Jan. 13, 2015 (JP) .................................. 2015-003810

(51) Int. Cl.
*H05K 7/20* (2006.01)
(52) U.S. Cl.
CPC ................................ *H05K 7/20772* (2013.01)
(58) Field of Classification Search
CPC ........... H05K 7/20763; H05K 7/20781; H05K 7/20772
USPC .......................... 361/688–702; 165/80.4–80.5
See application file for complete search history.

(56) References Cited

U.S. PATENT DOCUMENTS

| | | | | |
|---|---|---|---|---|
| 5,101,890 A * | 4/1992 | Aoki | ....................... | F25B 39/04 165/110 |
| 5,924,481 A * | 7/1999 | Tajima | ................ | F28D 15/0266 165/104.21 |
| 7,506,683 B2 * | 3/2009 | Hu | ........................ | F28D 1/0443 165/140 |
| 2006/0283579 A1* | 12/2006 | Ghosh | ................... | H01L 23/473 165/104.33 |
| 2007/0187077 A1* | 8/2007 | Kwon | .................. | F28D 1/0443 165/140 |
| 2013/0112373 A1* | 5/2013 | Fukai | ..................... | H01L 23/427 165/104.21 |
| 2013/0201628 A1* | 8/2013 | Aoki | ..................... | F28D 1/0476 361/699 |
| 2014/0071622 A1 | 3/2014 | Aoki et al. | | |
| 2014/0071624 A1* | 3/2014 | Aoki | .................. | H05K 7/20263 361/699 |
| 2016/0330874 A1* | 11/2016 | Sato | ......................... | F28F 1/40 |

FOREIGN PATENT DOCUMENTS

| | | |
|---|---|---|
| JP | 2-5326 | 2/1990 |
| JP | 11-230638 | 8/1999 |
| JP | 2014-52142 | 3/2014 |
| JP | 2014-53507 | 3/2014 |

* cited by examiner

*Primary Examiner* — Anthony Haughton
*Assistant Examiner* — Yahya Ahmad
(74) *Attorney, Agent, or Firm* — Fujitsu Patent Center

(57) ABSTRACT

A heat exchanger includes: a plurality of first heat radiation members, each of the plurality of first heat radiation members including a first refrigerant flow path through which a refrigerant flows; a plurality of second heat radiation members, each of the plurality of second heat radiation members including a second refrigerant flow path through which the refrigerant flows; and a fin attached between the plurality of second heat radiation members, wherein an interval between the plurality of first heat radiation members is smaller than an interval between the plurality of second heat radiation members.

14 Claims, 11 Drawing Sheets

HEAT EXCHANGER, COOLING UNIT, AND ELECTRONIC DEVICE

CROSS-REFERENCE TO RELATED APPLICATION

This application is based upon and claims the benefit of priority of the prior Japanese Patent Application No. 2015-003810, filed on Jan. 13, 2015, the entire contents of which are incorporated herein by reference.

FIELD

The embodiments discussed herein are related to a heat exchanger, a cooling unit, and an electronic device.

BACKGROUND

Recently, miniaturization of electronic devices such as a desktop personal computer, a mobile personal computer, and a server is being promoted. Electronic components such as a central processing unit (CPU) used in these electronic devices generate heat as they are operated.

When the temperature of the electronic components such as the CPU exceeds a permissible upper temperature limit, a problem such as a failure, malfunction, or a decrease in processing capability is caused. Thus, a means for cooling an electronic component that generates a large amount of heat is required.

An air-cooling method and a water-cooling method are used to cool the electronic components. In the case of cooling an electronic component that generates a large amount of heat, the water-cooling method is often employed. Hereinafter, the electronic component that generates a large amount of heat will be referred to as a heat generation component.

In a water-cooling type cooling apparatus, a heat receiving part is mounted on the heat generation component, and a heat exchanger and a cooling fan are arranged at a location that is spaced away from the heat receiving part, and the heat receiving part and the heat exchanger are connected to each other via a pipe. The heat receiving part is provided with a flow path through which the cooling water flows. By circulating the cooling water between the heat receiving part and the heat exchanger, the heat generated from the heat generation component is transferred to the heat exchanger, and then is dissipated from the heat exchanger to the atmosphere. The heat exchanger is provided with a plurality of heat radiation fins along a flow path through which a refrigerant flows.

Further, herein, water or other fluids (refrigerant) that are used for transferring heat from the heat receiving part to the heat exchanger will be referred to as "cooling water."

With the miniaturization of the electronic device, miniaturization is also required for the heat exchanger mounted in the electronic device. However, when the size of the heat exchanger is merely reduced, the flow path of the cooling water is narrowed so that a pressure loss increases and the flow rate of the cooling water flowing in the heat exchanger and the heat receiving part is reduced. Consequently, the heat exchange efficiency of the heat exchanger is lowered so that the heat generation component may not be sufficiently cooled.

The followings are a reference documents.

[Document 1] Japanese Laid-Open Patent Publication No. 2014-053507,
[Document 2] Japanese Laid-Open Patent Publication No. 2014-052142,
[Document 3] Japanese Examined Utility Model Registration Application Publication No. 02-005326 and
[Document 4] Japanese Laid-Open Patent Publication No. 11-230638.

SUMMARY

According to an aspect of the invention, a heat exchanger includes: a plurality of first heat radiation members, each of the plurality of first heat radiation members including a first refrigerant flow path through which a refrigerant flows; a plurality of second heat radiation members, each of the plurality of second heat radiation members including a second refrigerant flow path through which the refrigerant flows; and a fin attached between the plurality of second heat radiation members, wherein an interval between the plurality of first heat radiation members is smaller than an interval between the plurality of second heat radiation members.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, exemplary embodiments will be described with reference to the accompanying drawings.

First Exemplary Embodiment

Figure 1:
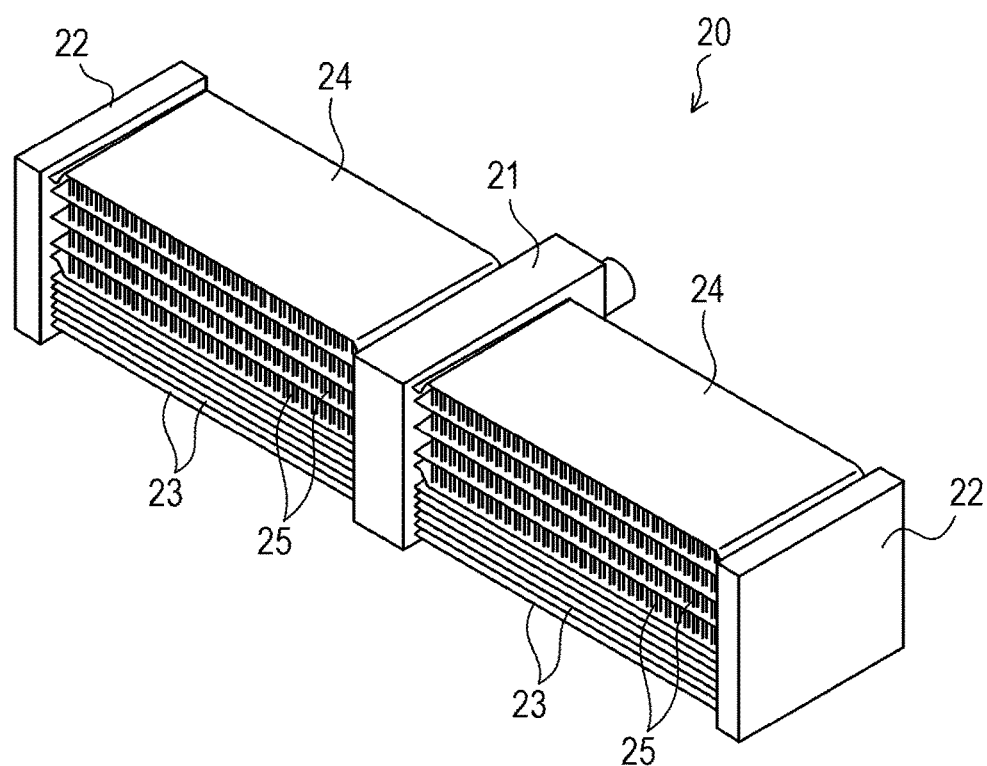
FIG. 1 is a perspective view illustrating a heat exchanger according to a first exemplary embodiment.
Figure 2:
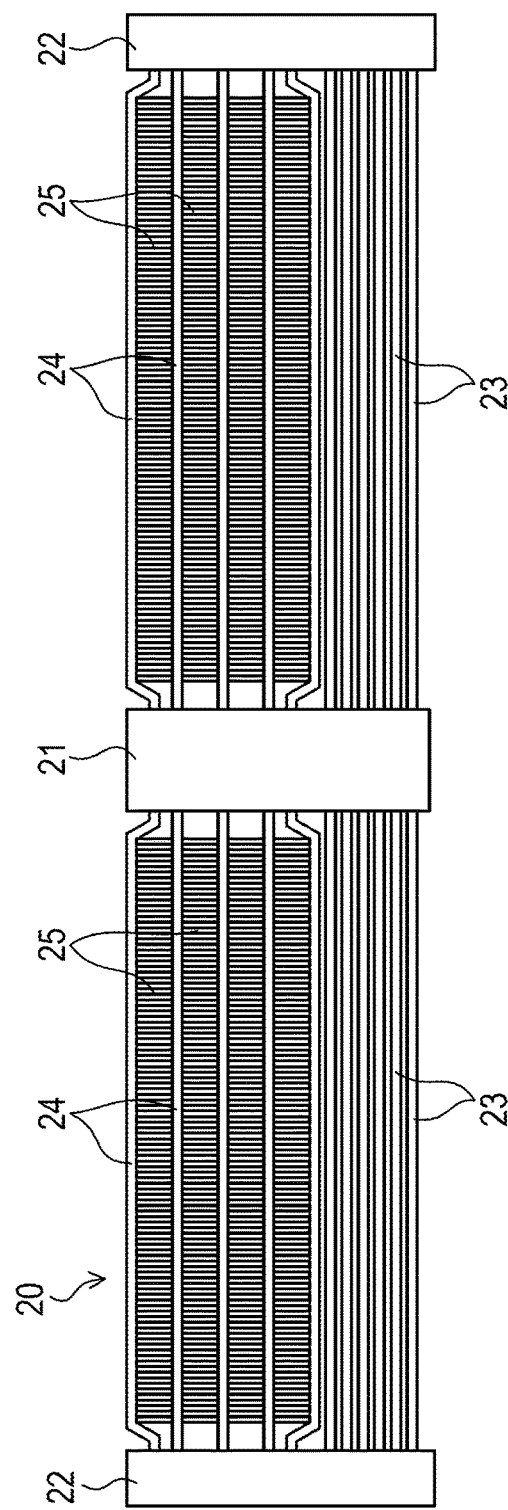
FIG. 2 is a front view illustrating the heat exchanger according to the first exemplary embodiment.

FIG. 1 is a perspective view of a heat exchanger 20 according to a first exemplary embodiment, and FIG. 2 is a front view of the same heat exchanger 20.

The heat exchanger 20 according to this exemplary embodiment includes a first header portion 21, a pair of second header portions 22 disposed with the first header portion 21 being interposed therebetween, and first and second heat radiation members 23 and 24 that interconnect the first header portion 21 and the second header portions 22.

All the first and second heat radiation members 23 and 24 are tube-shaped or plate-shaped members, each having therein a space through which the cooling water flows. The first heat radiation members 23 and the second heat radiation members 24 are disposed horizontally such that a plurality of first heat radiation members and a plurality of second heat radiation members are arranged side by side in the vertical direction, respectively.

In the present exemplary embodiment, a plate-shaped member called a perforated pipe is used as the first and second heat radiation members 23 and 24. In the perforated pipe, a plurality of holes, which perforate the perforated pipe from one end surface to the other end surface thereof, are provided in parallel. According to this exemplary embodiment, as illustrated in FIGS. 1 and 2, five first heat radiation members 23 are located at a lower side, while five second heat radiation members 24 are located at an upper side. In other words, in this exemplary embodiment, the first and second heat radiation members 23 and 24 are arranged side by side in a height direction.

Further, the number of each of the first and second heat radiation members 23 and 24 may be set as appropriate, without being limited to five (5). Further, the number of the first heat radiation members 23 may be different from the number of the second heat radiation members 24.

A plurality of heat radiation fins 25 are provided between the second heat radiation members 24. In order to install these fins 25, the interval between neighboring second heat radiation members 24 is set to be relatively large. In contrast, no fin is provided between the first heat radiation members 23, and the interval between the first heat radiation members 23 is set to be relatively small.

The first heat radiation members 23, the second heat radiation members 24, and the fins 25 are made of a metal having good heat conductivity such as, for example, aluminum or copper.

Figure 3:
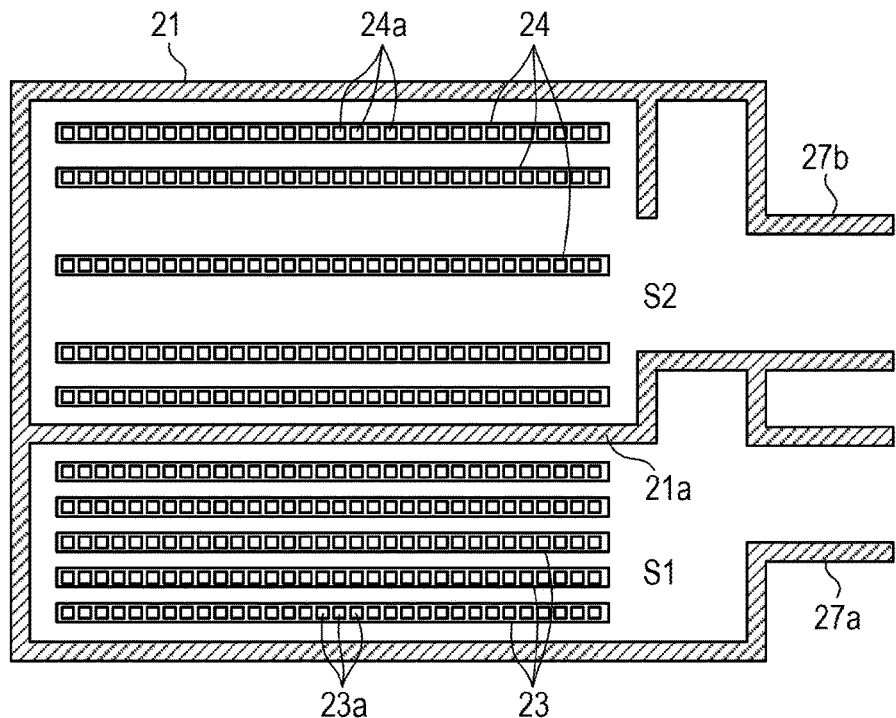
FIG. 3 is a sectional view illustrating a first header portion.
Figure 4:
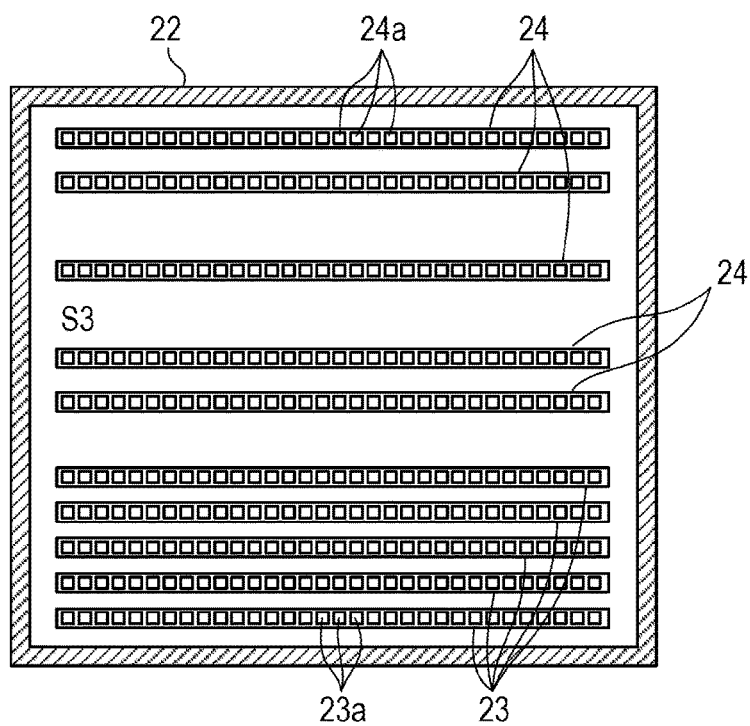
FIG. 4 is a sectional view illustrating a second header portion.

FIG. 3 is a sectional view illustrating the first header portion 21, and FIG. 4 is a sectional view illustrating the second header portion 22.

As illustrated in FIG. 3, the first header portion 21 is provided with a cooling water inlet 27a and a cooling water outlet 27b. Further, the first header portion 21 is partitioned into a first space S1 connected to the cooling water inlet 27a and a second space S2 connected to the cooling water outlet 27b, by a partition wall 21a. The first space S1 is located at a lower side, while the second space S2 is located at an upper side. The cooling water inlet 27a is an example of a first connection port, and the cooling water outlet 27b is an example of a second connection port.

The first space S1 is connected to a hole (hereinafter, referred to as a "cooling water flow path 23a") of the first heat radiation member 23, and the second space S2 is connected to a hole (hereinafter, referred to as a "cooling water flow path 24a") of the second heat radiation member 24.

The cooling water flowing from the cooling water inlet 27a into the first space S1 of the first header portion 21 further enters the cooling water flow path 23a of the first heat radiation member 23, and then moves to the second header portion 22 through the cooling water flow path 23a.

As illustrated in FIG. 4, the second header portion 22 is provided with a third space S3 that connects the cooling water flow path 23a of the first heat radiation member 23 with the cooling water flow path 24a of the second heat radiation member 24. The cooling water, which has entered the second header portion 22 from the cooling water flow path 23a of the first heat radiation member 23, flows upwards in the second header portion 22, and then enters the cooling water flow path 24a of the second heat radiation member 24. Further, the cooling water moves to the second space S2 of the first header portion 21 through the cooling water flow path 24a of the second heat radiation member 24, and is discharged from the cooling water outlet 27b.

Figure 5:
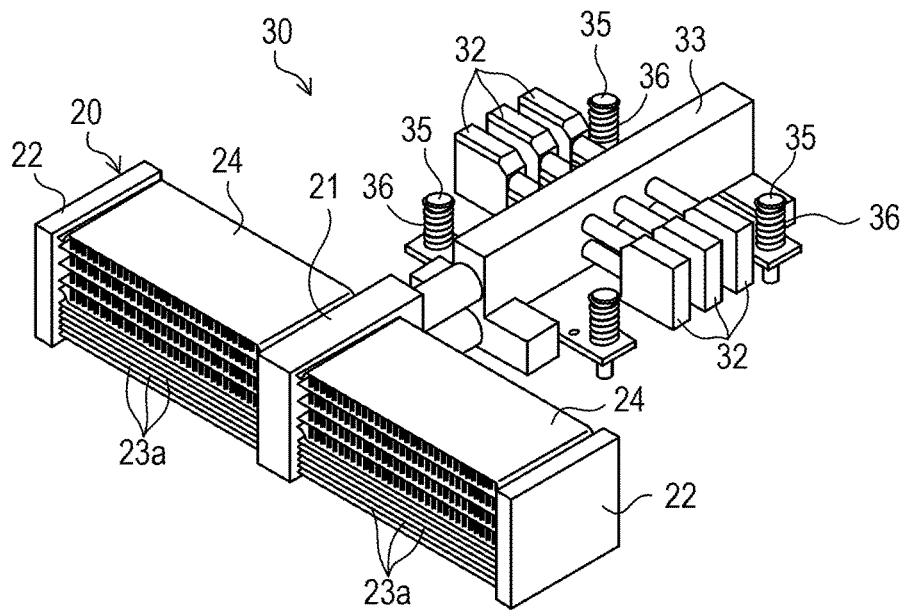
FIG. 5 is a perspective view illustrating a cooling unit including the heat exchanger according to the first exemplary embodiment.
Figure 6:
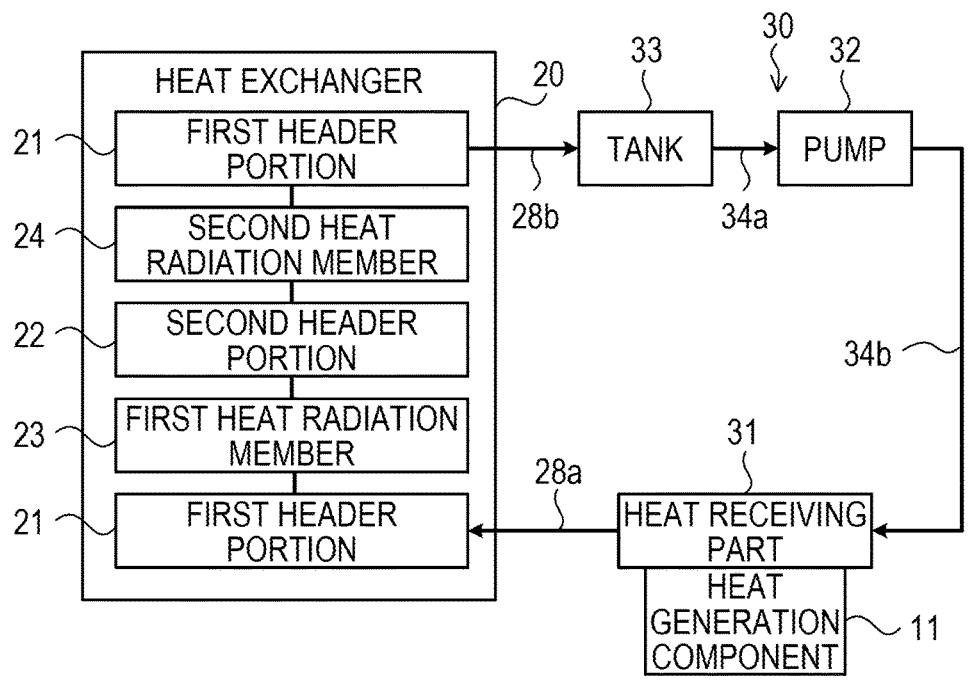
FIG. 6 is a block diagram illustrating the configuration of the cooling unit.
Figure 7:
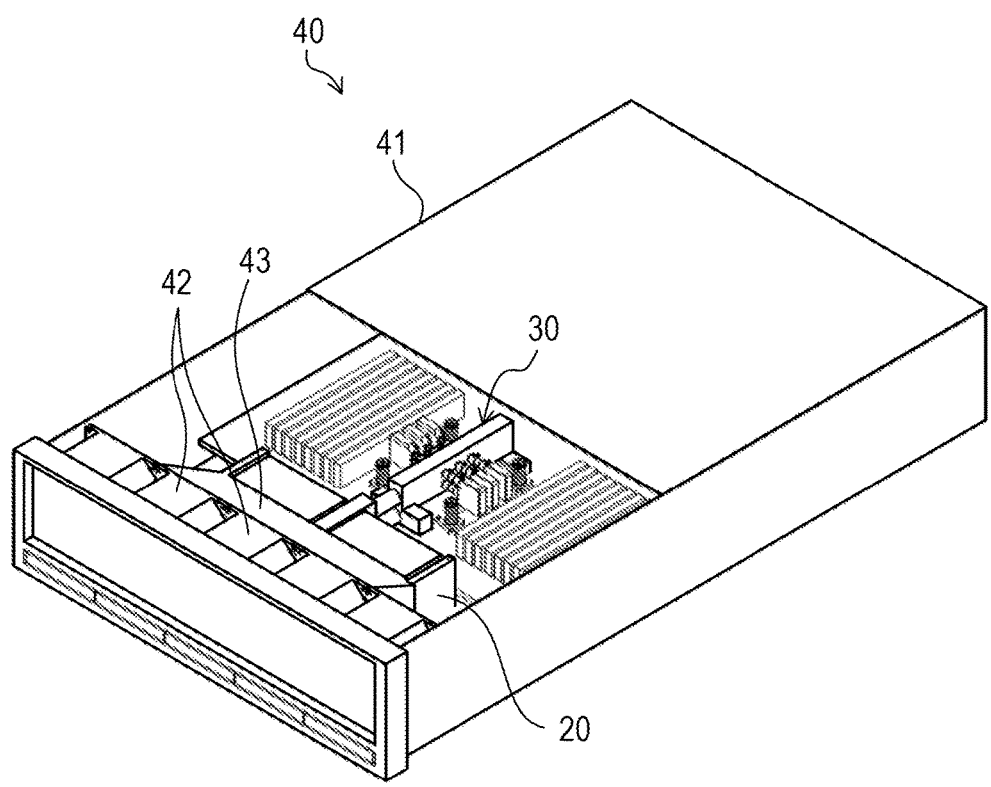
FIG. 7 is a perspective view illustrating an electronic device including the cooling unit.
Figure 8:
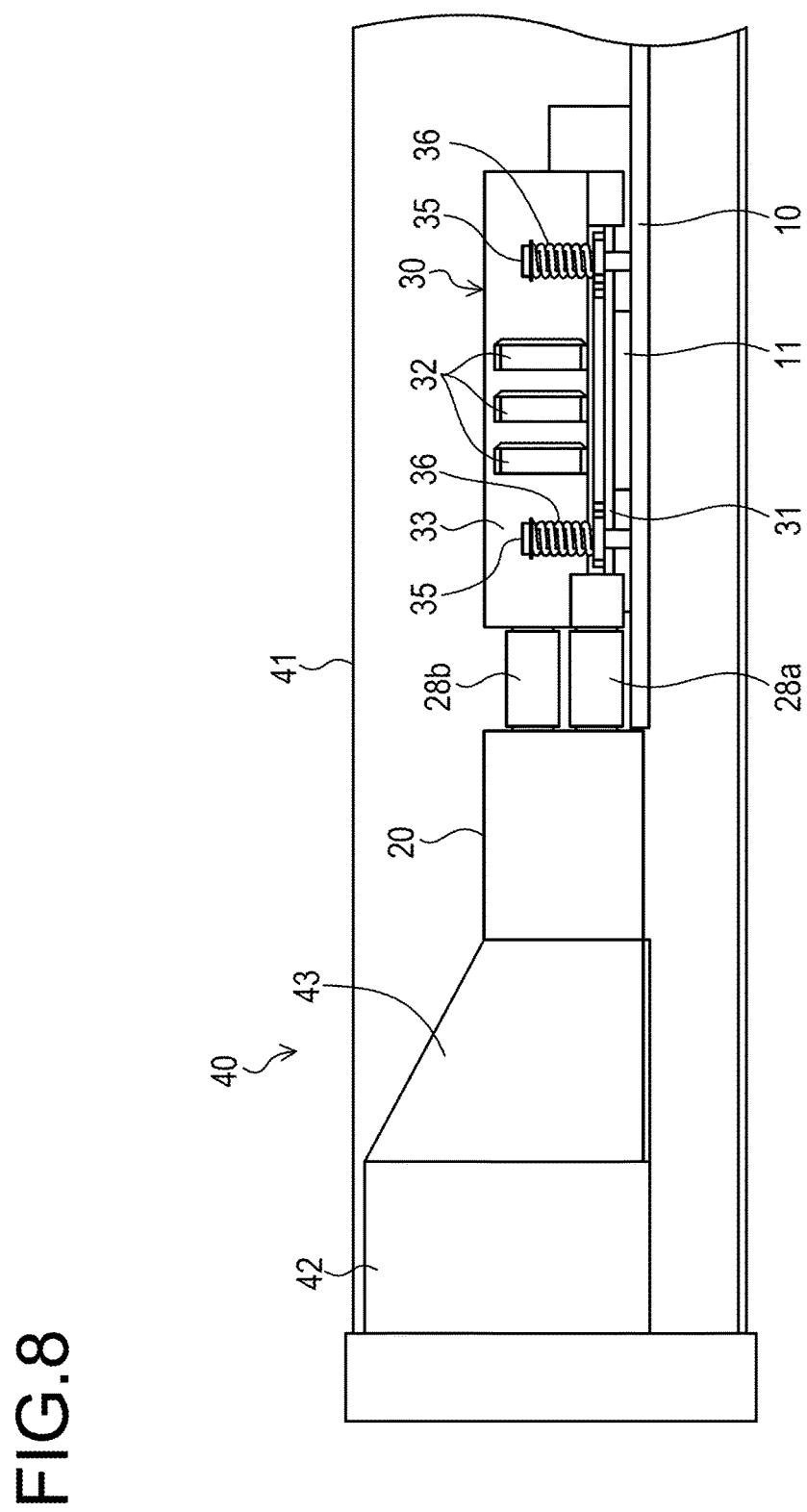
FIG. 8 is a side view illustrating the interior of the electronic device.
Figure 9:
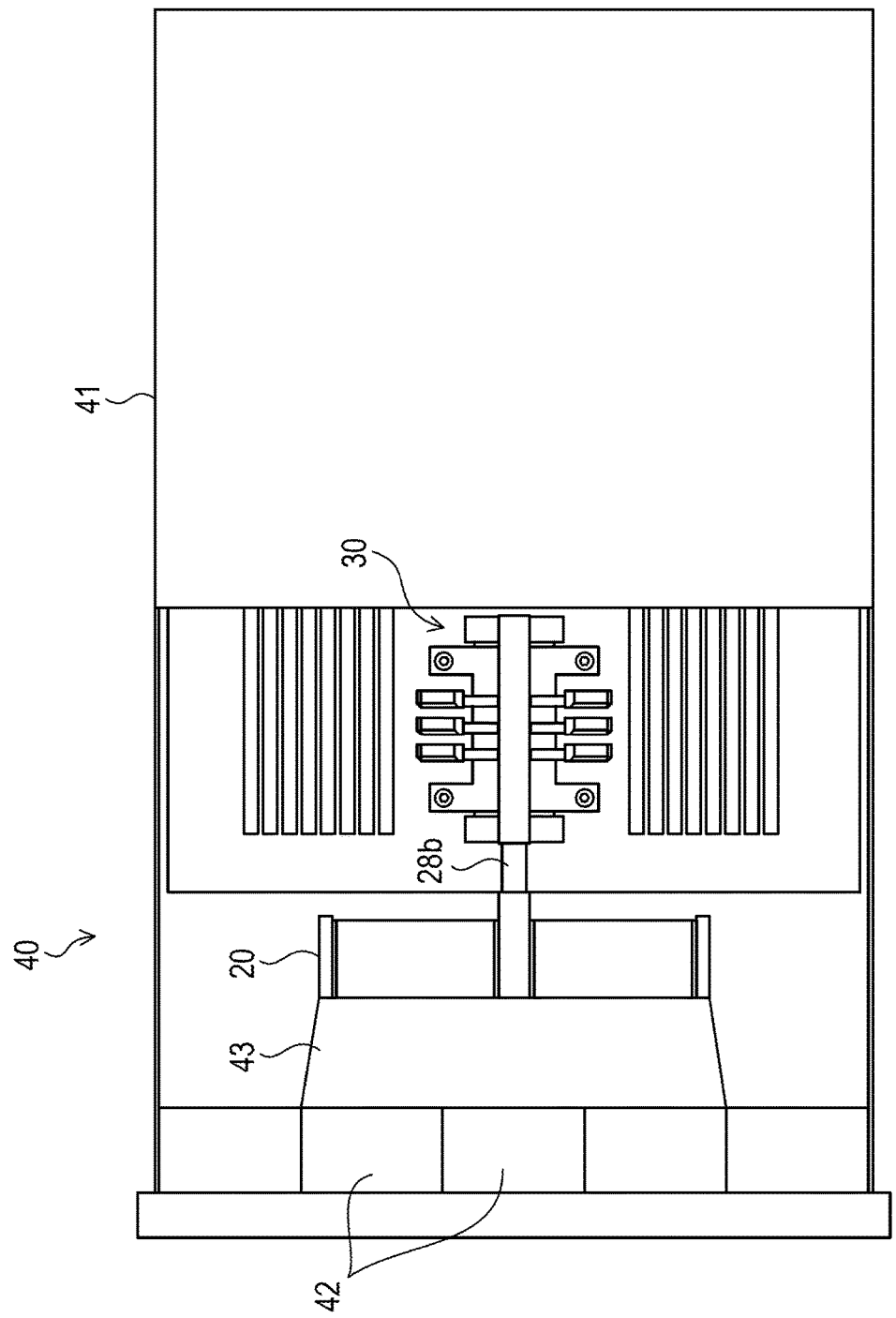
FIG. 9 is a plan view illustrating the interior of the electronic device.

FIG. 5 is a perspective view illustrating a cooling unit 30 having the above-described heat exchanger 20, and FIG. 6 is a block diagram illustrating the configuration of the same cooling unit 30. Further, FIG. 7 is a perspective view illustrating an electronic device 40 having the same cooling unit 30, FIG. 8 is a side view illustrating an interior of the same electronic device 40, and FIG. 9 is a plan view illustrating the interior of the same electronic device 40. Furthermore, arrows in FIG. 6 indicate the flow direction of the cooling water.

As illustrated in FIGS. 5 and 6, the cooling unit 30 includes a heat exchanger 20, a heat receiving part 31, a pump 32, and a tank 33. The heat receiving part 31 is provided with a flow path through which the cooling water flows, and is thermally connected to a heat generation component 11 (see, e.g., FIG. 8). Further, the heat generation component 11 and other electronic components are mounted on a circuit board 10.

The cooling water inlet 27a of the heat exchanger 20 is connected to the cooling water flow path in the heat receiving part 31 through a pipe 28a. Further, the cooling water outlet 27b is connected to the tank 33 through a pipe 28b. Further, as illustrated in FIG. 6, the tank 33 and the pump 32 are connected to each other by a cooling water flow path 34a, and the pump 32 and the heat receiving part 31 are connected to each other by a cooling water flow path 34b.

According to this exemplary embodiment, a plurality of pumps 32 (e.g., six pumps in FIG. 5) are connected in parallel between the tank 33 and the heat receiving part 31 to increase the flow rate of the cooling water. In this regard, the number of the pumps 32 may be set as appropriate. For example, the number of the pumps 32 may be one (1).

As illustrated in FIGS. 5 and 8, the cooling unit 30 is secured to the circuit board 10 by, for example, four locking pins 35 and springs 36.

The electronic device 40 includes a case 41, a circuit board 10, a cooling unit 30, and a cooling fan 42. The circuit board 10, the cooling unit 30, and the fan 42 are disposed within the case 41. In the electronic device 40 illustrated in FIGS. 7 and 8, a plurality of fans 42 are disposed on an end of the case 41, and a duct 43 is provided between the fans 42 and the heat exchanger 20 to guide air from the fans 42 to the heat exchanger 20.

Hereinafter, an operation of the cooling unit 30 according to this exemplary embodiment will be described.

The heat generation component 11 generates heat while being operated. However, since the heat generation component 11 is thermally connected to the heat receiving part 31 (see, e.g., FIGS. 6 and 8), the heat generation component 11 is cooled by the cooling water flowing in the heat receiving part 31 so that the temperature is kept under a permissible upper temperature limit. Further, the temperature of the cooling water flowing in the heat receiving part 31 rises as the heat generation component 11 is cooled.

The high-temperature cooling water discharged from the heat receiving part 31 flows into the first space S1 of the first header portion 21 of the heat exchanger 20 through the pipe 28a and the cooling water inlet 27a. Further, the cooling water flows from the first space S1 into the third space S3 of the second header portion 22 through the first heat radiation member 23. Furthermore, the cooling water flows from the second header portion 22 into the second space S2 of the first header portion 21 through the second heat radiation member 24 (see, e.g., FIGS. 3 and 4).

When the cooling water passes through the first and second heat radiation members 23 and 24, a heat exchange process is performed between the air sent by the fans 42 and the cooling water passing through the first and second heat radiation members 23 and 24, so that the temperature of the cooling water drops.

The low-temperature cooling water discharged from the cooling water outlet 27b of the heat exchanger 20 flows into the tank 33 through the pipe 28b. Further, the cooling water is temporarily stored in the tank 33, and then is transferred to the heat receiving part 31 by the pumps 32 (see, e.g., FIG. 6).

Thus, the cooling unit 30 according to the present exemplary embodiment sequentially circulates the cooling water through the heat receiving part 31, the heat exchanger 20, the tank 33, and the pumps 32, so that heat generated from the heat generation component 11 is transferred to the heat exchanger 20, and is dissipated from the heat exchanger 20 to the atmosphere.

For example, when the size of the heat exchanger is simply reduced as in the related art, the cooling water flow path of the heat radiation member is narrowed and the flow rate of the cooling water capable of flowing in the heat exchanger decreases. Further, the density of the fins increases, so that a significant pressure loss occurs in the air passing through the heat exchanger. Hence, when the size of the heat exchanger is simply reduced as in the related art, this leads to a considerable reduction in the heat exchange efficiency of the heat exchanger.

Whereas, the heat exchanger 20 according to the present exemplary embodiment is configured such that no fin is provided between the first heat radiation members 23 and the interval between the first heat radiation members 23 is small. Thus, the size of the heat exchanger may be reduced without reducing the size of the heat radiation members (e.g., the first and second heat radiation members 23 and 24). Further, since it is not necessary to reduce the size of the heat radiation members, a large amount of cooling water may flow into the heat exchanger 20.

Further, the heat exchanger 20 according to the present exemplary embodiment may be configured such that the interval between the first heat radiation members 23 is small and the interval between the second heat radiation members 24 is large. Thus, the fins 25 may be arranged at a proper density between the second heat radiation members 24. As described above, when the size of the heat exchanger according to the related art is merely reduced, the density of fins increases so that a significant pressure loss occurs in the air passing through the heat exchanger, but such a problem may be avoided in the heat exchanger 20 according to the present exemplary embodiment.

In the present exemplary embodiment, since no fin exists between the first heat radiation members 23, a pressure loss may decrease in the air passing through the heat exchanger 20 so that the entire cooling capacity of the apparatus is improved. Moreover, since the miniaturization of the apparatus may be realized without reducing the size of the heat radiation members 23 and 24, a pressure loss in the flow paths of the heat radiation members 23 and 24 may also be reduced, and consequently the flow rate of the cooling water may increase. Therefore, the temperature of the cooling water discharged from the heat exchanger 20 may be sufficiently lowered.

For example, according to the heat exchanger 20 of the present exemplary embodiment, the flow rate of the cooling water may increase 1.7 times while the flow rate of the air increases 1.2 times, as compared to the conventional heat exchanger having the same size. Accordingly, the heat exchanger 20 of the present exemplary embodiment has sufficiently high heat exchange efficiency even if the heat exchanger 20 is miniaturized. Further, since the cooling unit 30 and the electronic device 40 use the heat exchanger 20 that has high heat exchange efficiency, the heat generation component 11 may be sufficiently cooled.

Further, in the exemplary embodiment, descriptions have been made on a case where the second header portions 22, the first heat radiation members 23, and the second heat radiation members 24 are disposed on the opposite sides of the first header portion 21, respectively. However, the second header portion 22, the first heat radiation member 23 and the second heat radiation member 24 may be disposed on only one side of the first header portion 21.

Second Exemplary Embodiment

Figure 10:
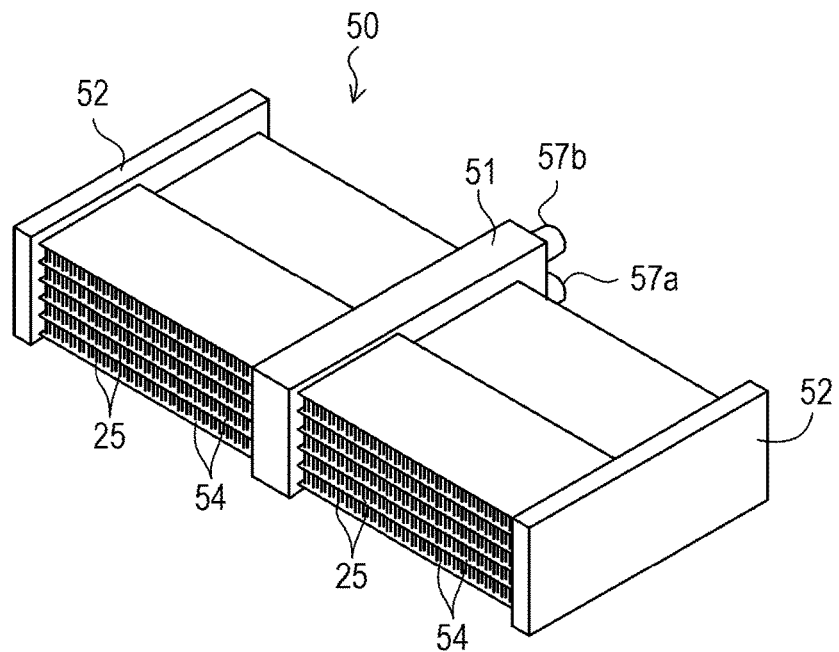
FIG. 10 is a perspective view illustrating a heat exchanger according to a second exemplary embodiment.
Figure 11:
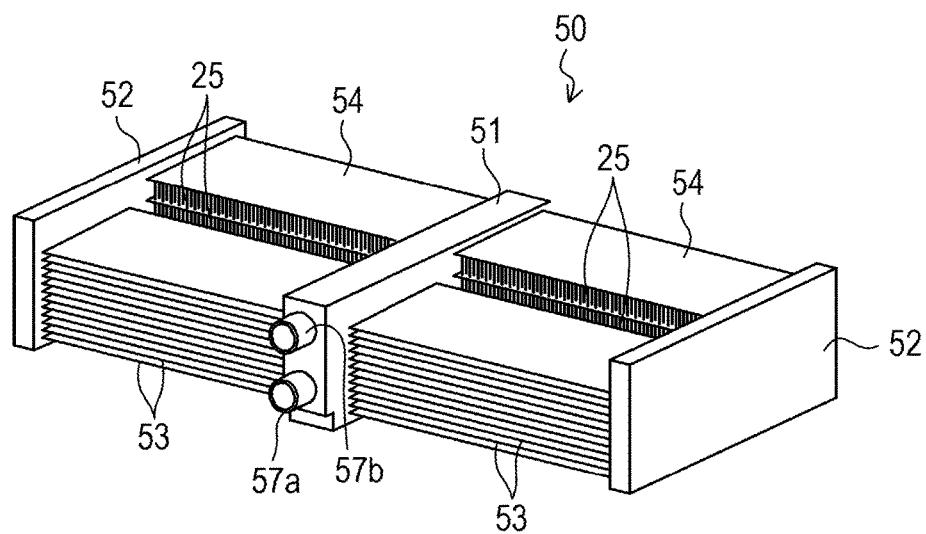
FIG. 11 is a perspective view illustrating the heat exchanger according to the second exemplary embodiment.

FIG. 10 is a perspective view illustrating a heat exchanger 50 according to a second exemplary embodiment when viewed from a rear side, and FIG. 11 is a perspective view illustrating the same heat exchanger 50 when viewed from a front side. Here, for the convenience of description, a side where a cooling water inlet 57a and a cooling water outlet 57b are provided is referred to as a front side while the opposite side thereof is referred to as a rear side.

The heat exchanger 50 according to the present exemplary embodiment includes a first header portion 51, a pair of second header portions 52 disposed with the first header portion 51 being interposed therebetween, and first and second heat radiation members 53 and 54 that interconnect the first and second header portions 51 and 52. As in the first exemplary embodiment, a perforated pipe is used as each of the first and second heat radiation members 53 and 54 in the present exemplary embodiment.

The first heat radiation members 53 and the second heat radiation members 54 are disposed horizontally such that a plurality of first heat radiation members and a plurality of second heat radiation members are arranged side by side in the vertical direction, respectively. According to the present exemplary embodiment, as illustrated in FIGS. 10 and 11, the plurality of first heat radiation members 53 are arranged in the front side (the side where a cooling water inlet 57a and a water outlet 57b are located), while the plurality of second heat radiation members 54 are arranged in the rear side. That is, in the present exemplary embodiment, assuming that the height direction is defined as a first direction, the direction where a first refrigerant flow path 53a extends is defined as a second direction, and the direction perpendicular to the first and second directions is defined as a third direction, the first and second heat radiation members 53 and 54 are arranged side by side in the third direction (front-rear direction).

The interval between the second heat radiation members 54 is set to be relatively large. Further, a plurality of heat radiation fins 25 are disposed at a suitable interval between the second heat radiation members 54. Meanwhile, no fin exists between the first heat radiation members 53, and the interval between the first heat radiation members 53 is set to be relatively small.

Figure 12:
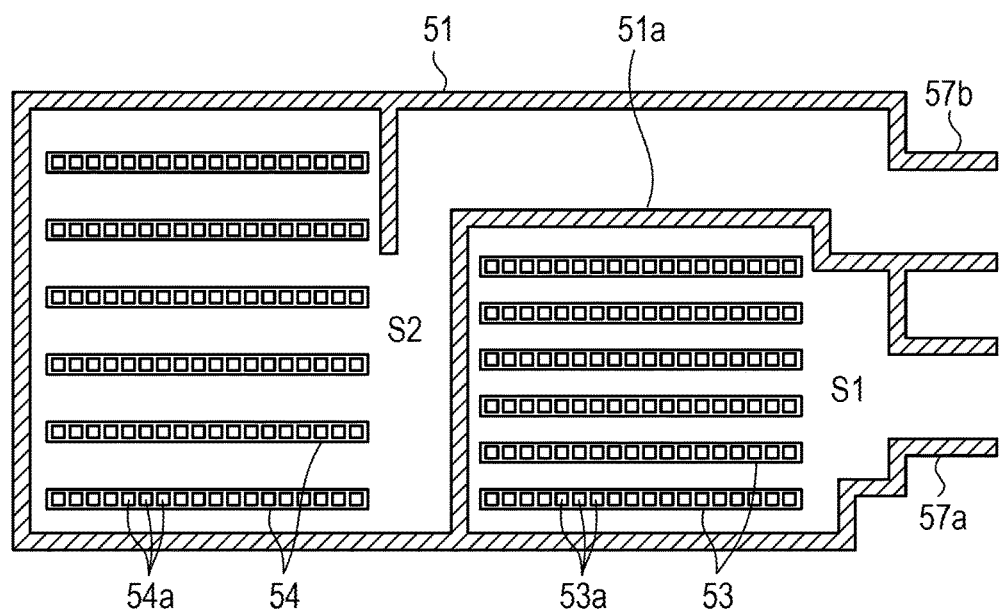
FIG. 12 is a sectional view illustrating a first header portion.
Figure 13:
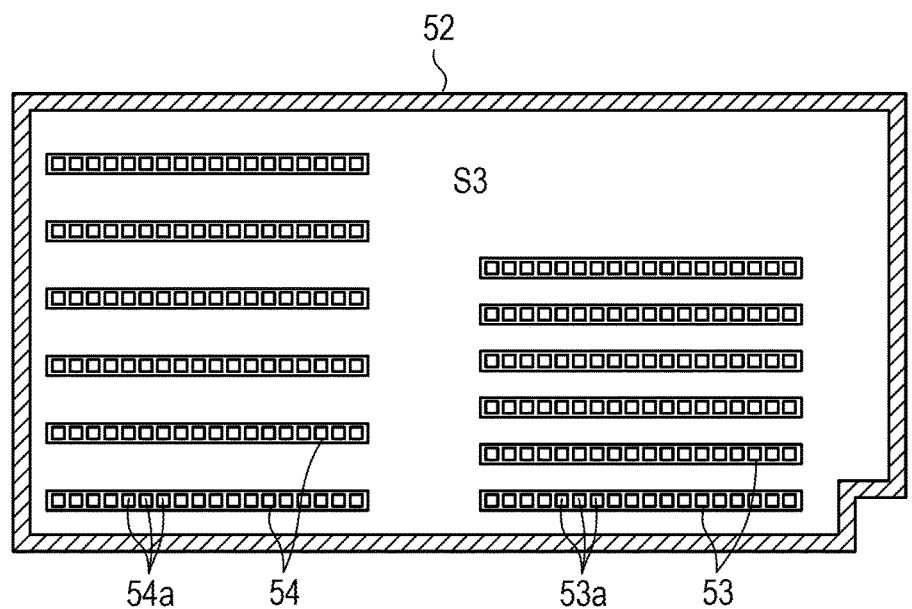
FIG. 13 is a sectional view illustrating a second header portion.

FIG. 12 is a sectional view illustrating the first header portion 51, and FIG. 13 is a sectional view illustrating the second header portion 52.

As illustrated in FIG. 12, a cooling water inlet 57*a* and a cooling water outlet 57*b* are provided in the first header portion 51. Further, the first header portion 51 is partitioned into a first space S1 connected to the cooling water inlet 57*a* and a second space S2 connected to the cooling water outlet 57*b*, by a diaphragm 51*a*. The first space S1 is connected to a hole (hereinafter, referred to as a "cooling water flow path 53*a*") of the first heat radiation member 53, and the second space S2 is connected to a hole (hereinafter, referred to as a "cooling water flow path 54*a*") of the second heat radiation member 54.

The cooling water, which has entered the first space S1 of the first header portion 51 from the cooling water inlet 57*a*, further enters the cooling water flow path 53*a* of the first heat radiation member 53, and moves to the second header portion 52 through the cooling water flow path 53*a*.

As illustrated in FIG. 13, the second header portion 52 is provided with a third space S3 that connects the cooling water flow path 53*a* of the first heat radiation member 53 with the cooling water flow path 54*a* of the second heat radiation member 54. The cooling water, which has entered the second header portion 52 from the cooling water flow path 53*a* of the first heat radiation member 53, flows in the second header portion 52 in a direction from the front side to the rear side, and then, enters the cooling water flow path 54*a* of the second heat radiation member 54. Further, the cooling water moves to the second space S2 of the first header portion 51 through the cooling water flow path 54*a* of the second heat radiation member 54, and then is discharged from the cooling water outlet 57*b*.

Figure 14:
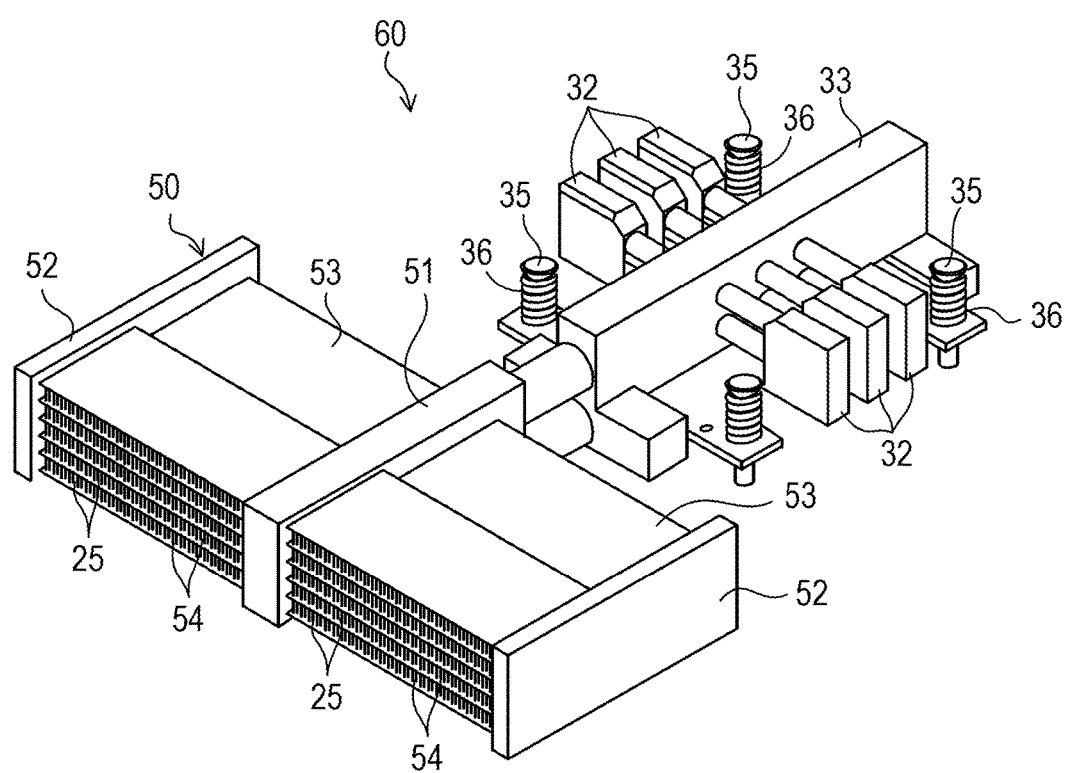
FIG. 14 is a perspective view illustrating a cooling unit including the heat exchanger according to the second exemplary embodiment.
Figure 15:
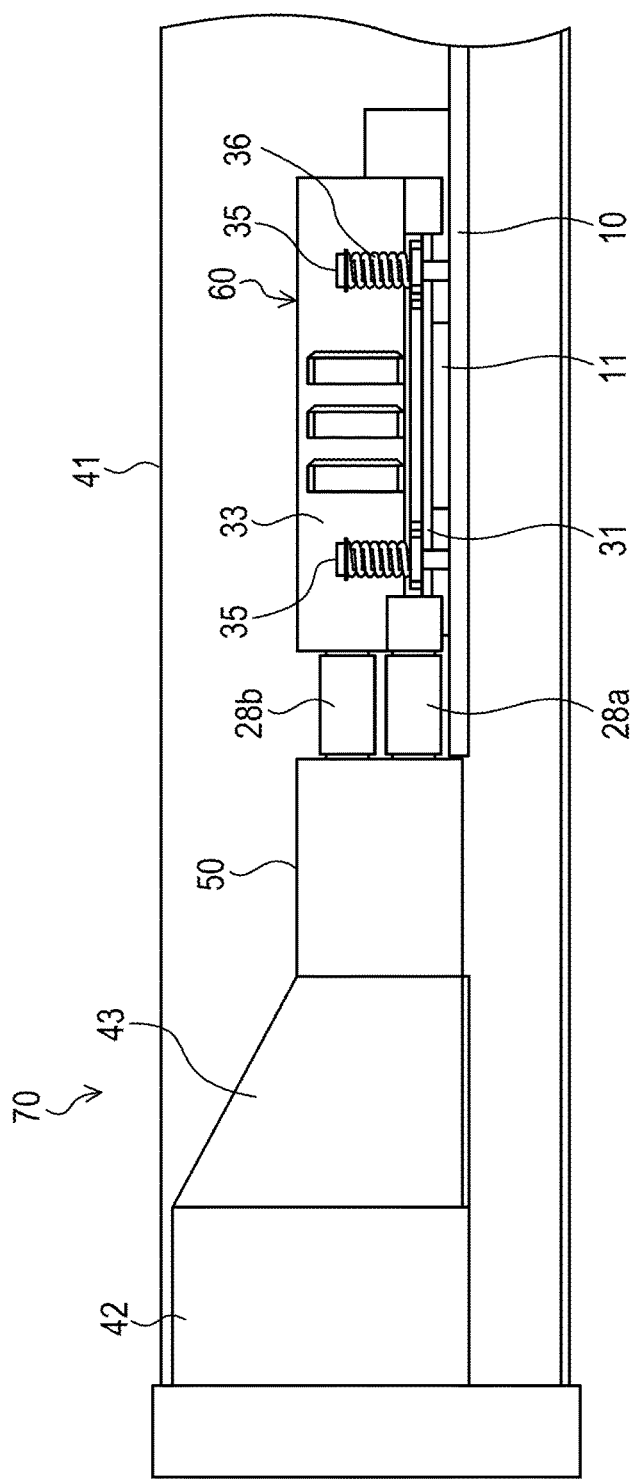
FIG. 15 is a side view illustrating the interior of an electronic device including the cooling unit.

FIG. 14 is a perspective view illustrating a cooling unit 60 having the above-described heat exchanger 50, and FIG. 15 is a side view illustrating the interior of an electronic device 70 including the cooling unit 60 of FIG. 14. Components of FIGS. 14 and 15, which are the same as those of FIGS. 5 and 8, will be denoted by the same reference numerals.

As illustrated in FIG. 14, the cooling unit 60 has a heat exchanger 50, a heat receiving part 31, a pump 32, and a tank 33. The cooling water inlet 57*a* of the heat exchanger 50 is connected to a cooling water flow path in the heat receiving part 31 via a pipe 28*a*, while the cooling water outlet 57*b* is connected to the tank 33 via a pipe 28*b*.

As illustrated in FIGS. 14 and 15, the cooling unit 60 is secured to the circuit board 10 by, for example, four locking pins 35 and springs 36.

Further, as illustrated in FIG. 15, the electronic device 70 includes a case 41, a circuit board 10, a cooling unit 60, and a cooling fan 42. The circuit board 10, the cooling unit 60, and the cooling fan 42 are disposed in the case 41.

Since a cooling water circulation course is the same as the first exemplary embodiment, a detailed description thereof will be omitted here.

As in the first exemplary embodiment, in the present exemplary embodiment, no fin exists between the first heat radiation members 53 and the interval between the first heat radiation members 53 is set to be small. Further, the heat exchanger 50 according to the present exemplary embodiment is configured such that the interval between the first heat radiation members 53 is small and the interval between the second heat radiation members 54 is set to be large. Thus, the fins 25 are arranged at a proper density between the second heat radiation members 54.

In this regard, similarly to the heat exchanger 20 according to the first exemplary embodiment, the heat exchanger 50 according to the present exemplary embodiment has sufficiently high heat exchange efficiency even if it is miniaturized. Further, since the cooling unit 60 and the electronic device 70 according to the present exemplary embodiment use the heat exchanger 50 that has high heat exchange efficiency, the heat generation component 11 may be sufficiently cooled down.

Further, in the exemplary embodiment, descriptions have been made on a case where the second header portions 52, the first heat radiation members 53, and the second heat radiation members 54 are disposed on the opposite sides of the first header portion 51. However, the second header portion 52, the first heat radiation member 53, and the second heat radiation member 54 may be disposed on only one side of the first header portion 51.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A heat exchanger comprising:
   a plurality of first heat radiation members, each of the plurality of first heat radiation members including a first refrigerant flow path through which a refrigerant flows;
   a plurality of second heat radiation members, each of the plurality of second heat radiation members including a second refrigerant flow path through which the refrigerant flows; and
   a fin attached between the plurality of second heat radiation members,
   wherein an interval between the plurality of first heat radiation members is smaller than an interval between the plurality of second heat radiation members, and no fin is provided between the plurality of first heat radiation members.

2. The heat exchanger according to claim 1, wherein the plurality of first heat radiation members and the plurality of second heat radiation members are arranged side by side in a vertical direction.

3. The heat exchanger according to claim 1, wherein the plurality of first heat radiation members and the plurality of second heat radiation members are arranged side by side in a horizontal direction.

4. The heat exchanger according to claim 1, further comprising:
   a first header portion partitioned into a first space and a second space; and
   a second header portion including a third space, wherein the first refrigerant flow path interconnects the first space and the third space, and the second refrigerant flow path interconnects the second space and the third space.

5. The heat exchanger according to claim 4, wherein the first header portion includes:
   a first connection port that is connected to the first space so that the refrigerant flows or flows out there through; and
   a second connection port that is connected to the second space so that the refrigerant flows in or flows out there through.

6. The heat exchanger according to claim 5, wherein the second header portion, the first heat radiation members, and the second heat radiation members are attached on each of opposite sides of the first header portion.

7. The heat exchanger according to claim 5, wherein the second header portion, the first heat radiation members, and the second heat radiation members are attached on only one side of the first header portion.

8. The heat exchanger according to claim 1, wherein each of the first and second refrigerant flow paths includes a perforated pipe including a plurality of holes arranged in parallel, each of the holes passing through the perforated pipe from one end surface of the perforated pipe to another end surface thereof.

9. A cooling unit comprising:
   a heat receiving part thermally connected to a heat generation component;
   a heat exchanger; and
   a pump that circulates a refrigerant between the heat receiving part and the heat exchanger,
   wherein the heat exchanger includes:
   a plurality of first heat radiation members, each of the plurality of first heat radiation members including a first refrigerant flow path through which a refrigerant flows;
   a plurality of second heat radiation members, each of the plurality of second heat radiation members including a second refrigerant flow path through which the refrigerant flows; and
   a fin attached between the plurality of second heat radiation members,
   wherein an interval between the plurality of first heat radiation members is smaller than an interval between the plurality of second heat radiation members, and no fin is provided between the plurality of first heat radiation members.

10. The cooling unit according to claim 9, further comprising:
    a tank that temporarily stores the refrigerant between the heat exchanger and the pump.

11. The cooling unit according to claim 9, wherein the pump is plural.

12. An electronic device comprising:
    a case;
    a heat generation component attached in the case;
    a heat receiving part attached in the case and thermally connected to the heat generation component;
    a heat exchanger; and
    a pump that circulates a refrigerant between the heat receiving part and the heat exchanger,
    wherein the heat exchanger includes:
    a plurality of first heat radiation members, each of the plurality of first heat radiation members including a first refrigerant flow path through which a refrigerant flows;
    a plurality of second heat radiation members, each of the plurality of second heat radiation members including a second refrigerant flow path through which the refrigerant flows; and
    a fin attached between the plurality of second heat radiation members,
    wherein an interval between the plurality of first heat radiation members is smaller than an interval between the plurality of second heat radiation members, and no fin is provided between the plurality of first heat radiation members.

13. The electronic device according to claim 12, wherein the pump is plural.

14. The electronic device according to claim 12, further comprising:
    a plurality of fans disposed on an end of the case; and
    a duct provided between the plurality of fans and the heat exchanger to guide air from the plurality of fans to the heat exchanger.

* * * * *